United States Patent [19]
Nakazato et al.

[11] Patent Number: 4,984,953
[45] Date of Patent: Jan. 15, 1991

[54] PLATE-LIKE ARTICLE CONVEYING SYSTEM

[75] Inventors: Horoshi Nakazato, OhmeTokyo; Mamoru Iijima; Akihiro Nakamura, both of Yokohama, all of Japan

[73] Assignee: Canon Kabushiki Kaisha, Tokyo, Japan

[21] Appl. No.: 500,117

[22] Filed: Mar. 27, 1990

Related U.S. Application Data

[63] Continuation of Ser. No. 156,979, Feb. 18, 1988, abandoned.

[30] Foreign Application Priority Data

| | | | |
|---|---|---|---|
| Feb. 20, 1987 | [JP] | Japan | 62-035747 |
| Feb. 20, 1987 | [JP] | Japan | 62-035748 |
| Feb. 20, 1987 | [JP] | Japan | 62-035749 |

[51] Int. Cl.$^5$ ............................................. B65G 1/06
[52] U.S. Cl. ..................................... 414/331; 220/260; 220/264; 414/225; 414/411; 414/783
[58] Field of Search ............... 414/331, 222, 225, 411, 414/416, 781, 783, 754, 744.8; 901/8; 206/454–456; 220/260, 263, 264

[56] References Cited

U.S. PATENT DOCUMENTS

| | | | |
|---|---|---|---|
| 3,823,836 | 7/1974 | Cheney et al. | 414/331 X |
| 4,135,800 | 1/1979 | Weidanz et al. | 206/455 X |
| 4,295,565 | 10/1981 | Takeuchi | 206/455 |
| 4,423,959 | 1/1984 | Nakazawa | 356/400 |
| 4,501,527 | 2/1985 | Jacoby et al. | 414/225 |
| 4,556,362 | 12/1985 | Bahnck et al. | 414/225 X |
| 4,611,967 | 9/1986 | Tsutsui | 414/411 |
| 4,677,301 | 6/1987 | Tanimoto et al. | 250/548 |
| 4,687,542 | 8/1987 | Davis et al. | 414/411 X |
| 4,712,016 | 12/1987 | Matsumura | 250/548 |
| 4,757,355 | 7/1988 | Iizuka et al. | 355/75 |
| 4,758,127 | 7/1988 | Imai et al. | 414/411 |
| 4,764,076 | 8/1988 | Layman et al. | 414/225 X |

FOREIGN PATENT DOCUMENTS

| | | | |
|---|---|---|---|
| 64928 | 4/1982 | Japan | 414/411 |
| 17919 | 1/1985 | Japan | 414/783 |

*Primary Examiner*—David A. Bucci
*Attorney, Agent, or Firm*—Fitzpatrick, Cella, Harper & Scinto

[57] ABSTRACT

A conveying system particularly suitably usable to convey a plate-like article such as a reticle or mask which is usable in transferring a microcircuit forming pattern onto a semiconductor wafer, is disclosed. The conveying system includes a first hand mechanism, a second hand mechanism and a reticle changing mechanism. The first hand mechanism is operable in the neighborhood of a reticle library to load and unload a reticle to and from a reticle cassette and also operable to convey a reticle between the library position and a first midway position. The second hand mechanism is operable to convey a reticle between a reticle setting position within an exposure apparatus and a second midway position. The reticle changing mechanism is operable to hold, at a time, a reticle supported at the first midway position by the first hand mechanism and a reticle supported at the second midway position by the second hand mechanism. Also, the reticle changing mechanism is operable to convey these reticles, at a time, so that their positions are interchanged. This arrangement allows conveyance of plural reticles between the library position and the reticle setting position in the exposure apparatus, while effecting sequential changing of the reticles. Further, the reticle library is made movable relatively to the first hand mechanism and in a direction along which the reticle cassettes are disposed in a layered fashion. This assures efficient utilization of the first hand mechanism, for plural reticle cassettes. Thus, the conveying system permits high-speed reticle changing.

2 Claims, 10 Drawing Sheets

PLATE-LIKE ARTICLE CONVEYING SYSTEM

This application is a continuation of application Ser. No. 07/156,979 filed Feb. 18, 1988, now abandoned.

FIELD OF THE INVENTION AND RELATED ART

This invention relates to an article conveying system and, more particularly, to an article conveying system particularly suitable for use in an apparatus used in the manufacture of semiconductor devices such as integrated microcircuits, for automatically conveying a plate-like article such as a reticle or mask.

In a photolithographic process made to a semiconductor wafer, minute circuit patterns are formed on chips of a wafer. For this purpose, a mask having actual-dimension patterns is used and is contacted to a wafer having a surface resist layer, the wafer being exposed to the mask patterns with radiation such as light. Alternatively, a reticle having one or more patterns corresponding to one or more chips and having a size several to ten times larger than the actual dimension, is used in combination with a suitable optical means such as a projection lens system, so that the reticle pattern is projected in a reduced scale upon each of different portions (shot areas) of a wafer.

In order to complete one semiconductor device, the pattern printing process (photoprinting process) is repeatedly executed. Usually, for one wafer, several to several tens of repetitions of the pattern printing process are necessary.

Actually, a first mask or reticle for a first mask process is set in an exposure apparatus and, subsequently, the pattern printing process is conducted in sequence to semiconductor wafers of a predetermined number (e.g. one hundred). These wafers, after having been subjected to the photoprinting process, are then subjected to various treatments, as required, such as an etching treatment, an impurity diffusion treatment, the formation of a conductive layer, an insulative layer and a semiconductive layer and, additionally, a photoresist coating treatment. Thereafter, the first mask or reticle is replaced by a second mask or reticle for a second mask process, and each of the wafers is subjected to the pattern printing process using the second mask or reticle. Similarly, the photoprinting is repeated by use of succeeding masks or reticles, whereby desired circuit patterns are finally formed on each of the wafers.

Usually, masks or reticles for use in such photoprinting process are kept in cassettes, one by one. Since both the mask and the reticle are an original having a pattern to be transferred or printed on a wafer, description will now be made to the case of reticles, for simplicity of explanation.

Usually, a plurality of reticle cassettes each containing a reticle are placed in a cassette library fixedly mounted to the main assembly of an exposure apparatus. Usually, a desired reticle is extracted from a corresponding cassette placed in the cassette library (the extraction being made within the library) and the thus extracted reticle is conveyed along a long conveyance path to an exposure station within the exposure apparatus. Also, along the same conveyance path, the reticle is returned, after use, back to the library.

In such a reticle conveying system described above, there is an inconvenience in relation to the change of reticles. Namely, it is not possible to feed or forward a new reticle to the exposure station until a reticle having been used moves out of the conveyance path, i.e. until the reticle returning operation is completed. This requires a long time for changing reticles. Therefore, the exposure apparatus has to be placed in a stand-by state for a long time, waiting for the supply of a new reticle.

Generally, the semiconductor device production lines may be classified into two types, i.e. a mass-production line adapted for production of devices of a few varieties and a short-run-job production line adapted for production of many varieties of devices. Particularly in the latter case, the reticle changing is made frequently. Therefore, the necessity of a long time for the reticle changing (i.e. the necessity of a long stand-by time) decreases the productivity remarkably. This is undesirable.

SUMMARY OF THE INVENTION

It is accordingly a primary object of the present invention to provide a plate-like article conveying system which does not require a complicated conveying mechanism.

It is another object of the present invention to provide a plate-like article conveying system which is suitably usable for automatic reticle changing in an exposure apparatus usable in a semiconductor device manufacturing process, and which system is effective to complete the reticle change in a reduced time.

It is a further object of the present invention to provide a reticle conveying and changing system which is suitably usable in a semiconductor device manufacturing exposure apparatus and which is effective to make use of the exposure apparatus in a short-run-job production line adapted for the production of many varieties of semiconductor devices.

Briefly, in accordance with an aspect of the present invention, to achieve at least one of the above objects, there is provided a reticle conveying system which includes a first hand mechanism operable at a first position to extract and/or introduce a reticle out of and/or into a reticle keeping shelf and operable to convey a reticle between the first position and a second position; a reticle changing mechanism operable to change reticles being at the second position and a third position, respectively; and a second hand mechanism operable to convey a reticle between the third position and a fourth position and operable, at the fourth position, to transfer a reticle to and/or from an apparatus in which the conveying system is incorporated.

This arrangement allows quick loading, conveyance and/or unloading of a reticle without the need for a complicated conveying and changing mechanism.

In a case where the conveying system of the present invention is applied to a "reticle changer" in an exposure apparatus, a plurality of reticle cassettes each being adapted to keep therein an individual reticle may be placed in a reticle keeping shelf in a layered fashion.

It is yet another object of the present invention to provide an improved conveying system wherein a forward conveyance path and a backward conveyance path are partially separated from each other to assure improved efficiency of conveyance.

To achieve this object, in accordance with one aspect of the present invention, there is provided a plate-like article conveying system having the features described above, and additionally, being arranged so that a hand which is movable between the first and second positions is made movable into a reticle keeping shelf and that the reticle keeping shelf as a whole is made movable in a direction orthogonal to the direction along which the hand advances. This arrangement allows transfer of plural reticles between the hand and the keeping shelf.

Thus, according to the present invention, at a fixed position the hand can operate to extract any one of reticles out of corresponding reticle cassette placed in a reticle keeping shelf. Therefore, an opening/closing mechanism for opening/closing a door of each cassette can be provided at a fixed position.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
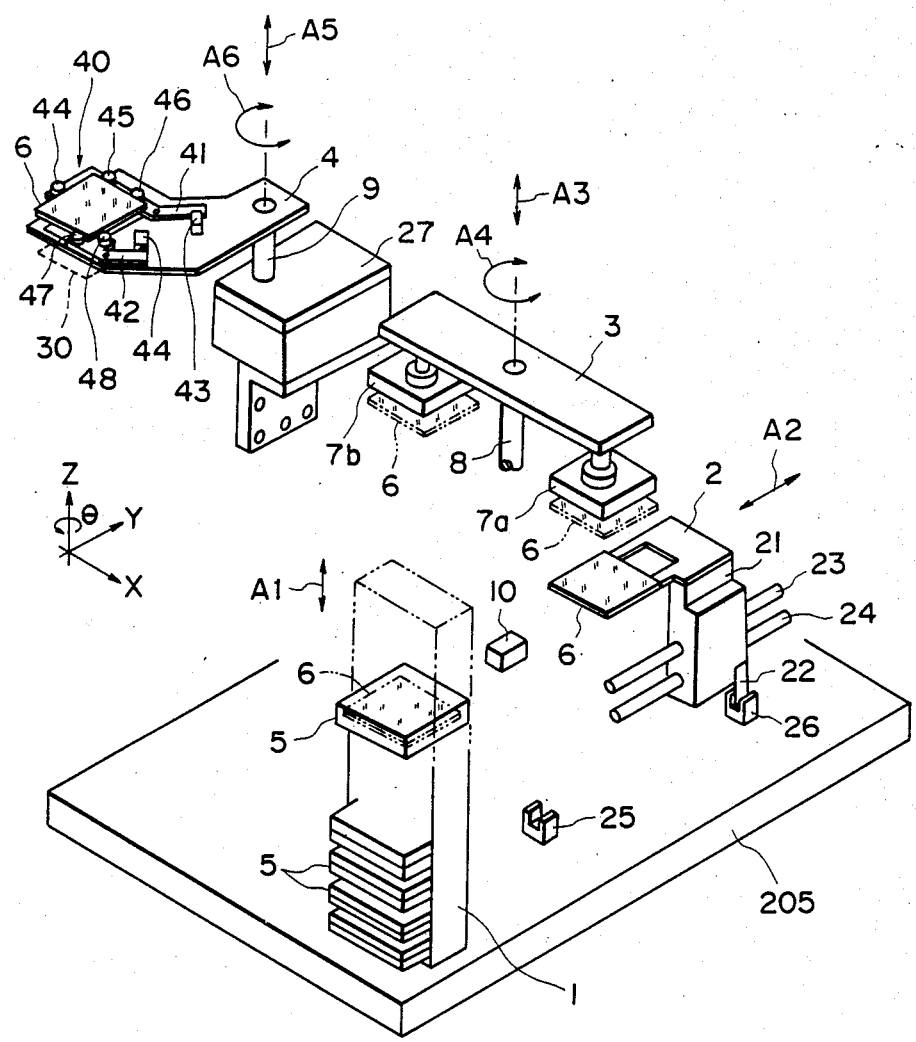
FIG. 1 is a perspective view schematically showing a conveying mechanism portion of a reticle changer to which a conveying system according to an embodiment of the present invention is applied.

Referring first to FIG. 1, there is schematically shown a conveying mechanism portion of a reticle changer to which a conveying system according to one embodiment of the present invention is applied.

Denoted generally at 1 in FIG. 1 is a reticle library which is arranged to hold, in a layered fashion along a Z axis, a plurality of reticle cassettes 5 each containing one reticle on which a pattern to be photoprinted on a semiconductor wafer is formed. The reticle library 1 is arranged to be moved upwardly and downwardly along the Z axis as denoted by an arrow A1, by means of a servo motor (not shown) to which a ball screw mechanism (not shown) is coupled. The reticle library 1 is moved along the Z axis so as to set a desired one of the reticle cassettes 5 at a reticle extracting station. Although not shown in the drawing, there is provided a door opening/closing mechanism at a fixed position which corresponds to the reticle extracting station of the reticle library 1.

Reticle extracting hand 2 is operable to perform reticle extraction, reticle conveyance and reticle introduction in relation to a reticle cassette 5 which is set at the reticle extracting station. The extracting hand 2 is fixed to a block 21 which is movable along guide bars 23 and 24 under the influence of a pulse motor (not shown). Thus, the extracting hand 2 is movable along a Y axis as denoted by an arrow A2. The ends of movement of the hand 2 are detected by means of photocouplers 25 and 26 and a light-blocking plate 22 which is fixed to the block 21. When a reticle 6 is extracted and conveyed by the extracting hand 2, a bar code provided on the reticle 6 is read, during the conveyance, by means of a barcode reader 10 which is provided in the neighborhood of the conveyance path.

Denoted at 3 in FIG. 1 is a quick hand which has two holding portions 7a and 7b adapted to hold two reticles 6 by vacuum suction. Thus, the quick hand 3 can hold two reticles at a time. The quick hand 3 is arranged to be moved upwardly and downwardly along the Z axis as denoted by an arrow A3 by means of a driving mechanism, not shown. Also, the quick hand 3 is arranged to be rotationally moved in a $\theta$ direction about a shaft 8 as denoted by an arrow A4, by means of the unshown driving mechanism. The holding portions 7a and 7b are disposed substantially symmetrically with respect to the shaft 8. Briefly, the quick hand 3 operates to transfer a reticle 6 from the extracting hand 2 to a forwarding hand 4, and also to transfer a reticle in an opposite direction. Thus, the quick hand 3 functions simultaneously to change "old" and "new" reticles at one time.

The forwarding hand 4 is operable to feed or forward a reticle 6 onto a reticle stage 30 which is placed inside the main assembly of an exposure apparatus such as a stepper. The forwarding hand 4 has a positioning mechanism 40 effective to position a reticle with respect to the reticle stage 30. The forwarding hand 4 is arranged to be rotationally moved in the $\theta$ direction about a shaft 9 as denoted by an arrow A6 by means of a driving mechanism 27. Also, the forwarding hand 4 is made movable upwardly and downwardly along the Z axis as denoted by an arrow A5, under the influence of the driving mechanism 27.

The positioning mechanism 40 of the hand 4 includes a lever 41 having positioning rollers 44, 45 and 46 and another lever 42 having positioning rollers 47 and 48. These levers 41 and 42 are made movable rotationally about respective pivot shafts mounted to the hand 4, by means of air cylinders 43 and 44, respectively, such that the positioning rollers 44-48 are pressed against the sides of a reticle 6, as illustrated, to position the same with respect to the reticle stage 30.

After the positioning of a reticle 6 by the positioning mechanism 40 is completed, the hand 4 moves downwardly so as to place the reticle 6 upon the reticle stage 30. By the exposure operation made in the exposure apparatus, the pattern of the reticle 6 placed on the reticle stage 30 is printed upon a wafer. It is to be added that an element denoted at 205 in FIG. 1 is a base member upon which the above-described mechanisms are supported.

Details of a reticle loading operation for loading a reticle upon the reticle stage 30 will now be described, taken in conjunction with the flow chart of FIG. 2.

First, at Step S11, the reticle library 1 is moved upwardly or downwardly to a suitable position allowing extraction of a reticle 6 contained in a designated cassette 5. Subsequently, at Step S12, a door of the selected reticle cassette 5 is opened. By this, an opening formed in the reticle cassette 5, through which the contained reticle 6 can be extracted, is exposed. The opening/closing of the door is carried out by means of the opening/closing mechanism (not shown) annexed to the reticle library 1.

Subsequently, at Step S13, the extracting hand 2 is moved into the reticle cassette 5. Then, at Step S14, the reticle library 1 is moved downwardly by a minute distance necessary for allowing transfer of the reticle 6. At the end of such downward movement of the library 1, the designated reticle 6 is placed on the extracting hand 2. Thus, at Step S15, a vacuum is supplied to the extracting hand 2 with the result that the reticle 6 is held by the hand 2.

Thereafter, at Step S16, the extracting hand 2 is moved backwardly to the position shown in FIG. 1. During this backward movement, the bar-code reader 10 operates to read a bar-code formed on the reticle 6 being conveyed (Step S17). Whether or not the extracting hand 2 has returned, is checked at Step S18 by use of electric signals from the photocoupler 26. Thereafter, at Step S19, the door of the cassette 5 is closed.

The above-described sequence from point S1 to point A in FIG. 2 may be called "reticle preparation" by which a reticle 6 to be used subsequently can be placed on the extracting hand 2 in preparation.

Next, at Step S20, the quick hand 3 is moved downwardly. At Step S21, a vacuum is applied to the holding portion 7a of the quick hand 3, while on the other hand, at Step S22 the supply of the vacuum to the extracting hand 2 is stopped. As a result, the reticle 6 placed on the extracting hand 2 is attracted to and held by the quick hand 3 by vacuum suction. Thereafter, at Step S23, the quick hand 3 is moved upwardly to lift the reticle 6. Subsequently, at Step S24, the quick hand 3 is rotated by 180 degrees about the shaft 8, for the reticle changing. The rotation of the quick hand 3 moves the reticle 6 to the position of the forwarding hand 4 as the hand 4 is positioned, at the time just before the rotation of the quick hand 3, just underneath the holding portion 7b of the quick hand 3.

Thereafter, at Step S25, the quick hand 3 is moved downwardly. At Step S26, a vacuum is supplied to the forwarding hand 4 while, on the other hand, at Step S27 the vacuum supply to the quick hand 3 is stopped. As a result, the reticle 6 is transferred to the forwarding hand 4. Then, at Step S28, the quick hand 3 is moved upwardly.

The sequence from point A to point B in FIG. 2 may be called "reticle changing" by which a reticle 6 to be used subsequently can be placed on the forwarding hand 4.

Next, at Step S29, the reticle positioning mechanism 40 annexed to the forwarding hand 4 operates to adjust the position of the reticle 6 with respect to the reticle stage 30 of the exposure apparatus. After the positioning is completed, the hand 4 is rotated to move the reticle 6 into the main assembly of the exposure apparatus and, then, is moved downwardly so as to place the reticle 6 upon the reticle stage 30.

Figure 2:
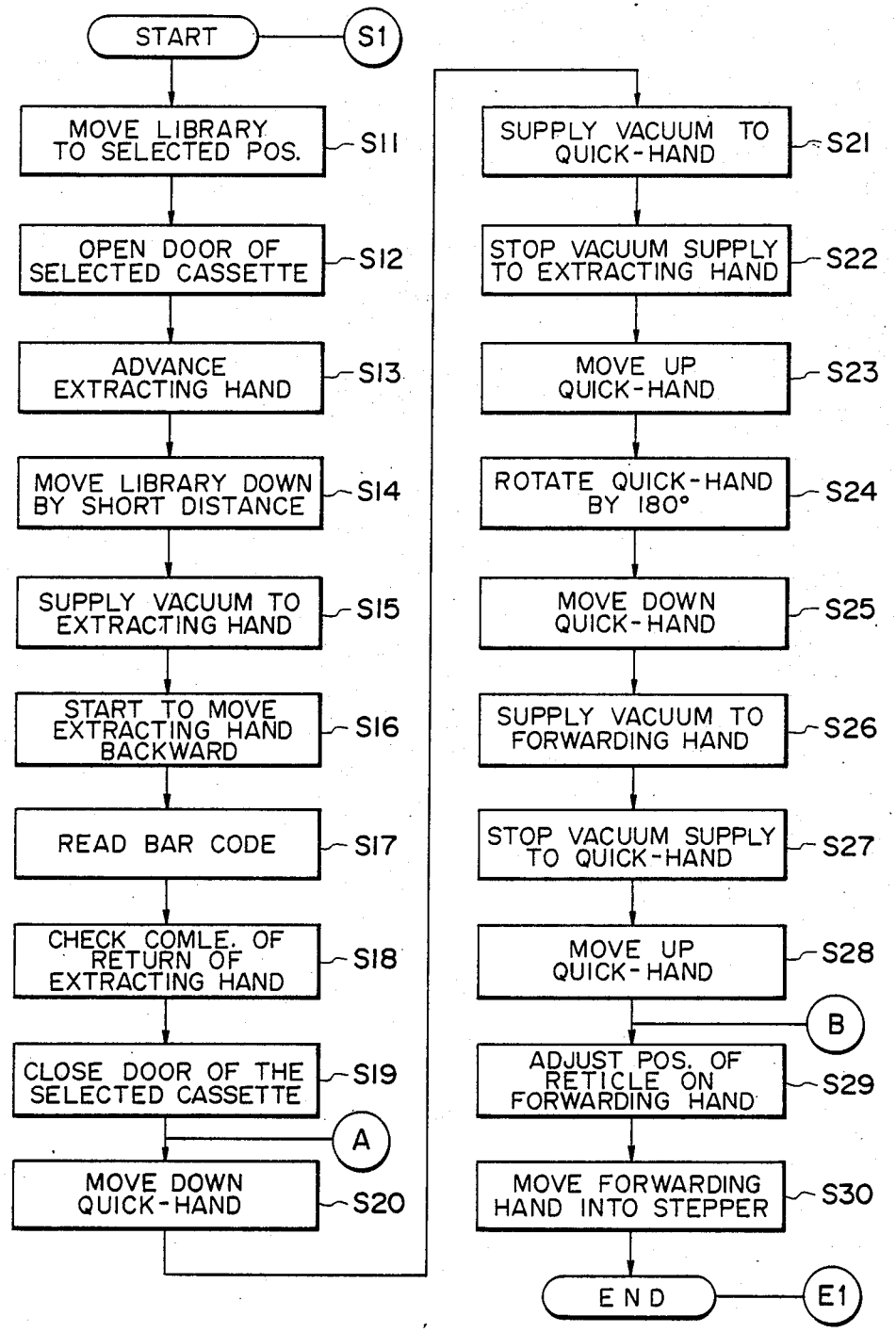
FIG. 2 is a flow chart showing the sequence of a reticle loading operation.

The sequence from point B to point E1 in FIG. 2 may be called "reticle setting" by which a reticle 6 can be set at the exposure station in the exposure apparatus.

By the above-described operations, the loading of a reticle into the exposure apparatus is completed.

Description will now be made of details of the reticle unloading, taken in conjunction with the flow chart of FIG. 3.

After the photoprinting process using a reticle 6 placed on the reticle stage 30 is completed, the forwarding hand 4 is moved upwardly and then rotationally from the position shown in FIG. 1 (Step S31) with the result that the reticle 6 is moved out of the exposure station. This operation made between point S2 to point C in FIG. 3 may be called "reticle extraction" by which a reticle can be unloaded from the exposure station.

Next, at Step S32, the quick hand 3 is moved downwardly. At Step S33, a vacuum is supplied to the holding portion 7b of the quick hand 3 while, on the other hand, at Step S34 the supply of vacuum to the forwarding hand 4 is intercepted. Thus, the reticle 6 on the forwarding hand 4 is attracted to and held by the quick hand 3. In this state, the quick hand 3 to which the reticle 6 is attracted is moved upwardly (Step S35).

Subsequently, at Step S36, the quick hand 3 is rotated about the shaft 8 by 180 degrees and, thereafter, the hand 3 is moved downwardly (Step S37). Then, at Step S38, a vacuum is supplied to the extracting hand 2 and, at Step S39, the vacuum supply to the holding portion 7b of the quick hand 3 is stopped. As a result, the reticle 6 is transferred to the extracting hand 2. Thereafter, at Step S40, the quick hand 3 is moved upwardly.

Figure 3:
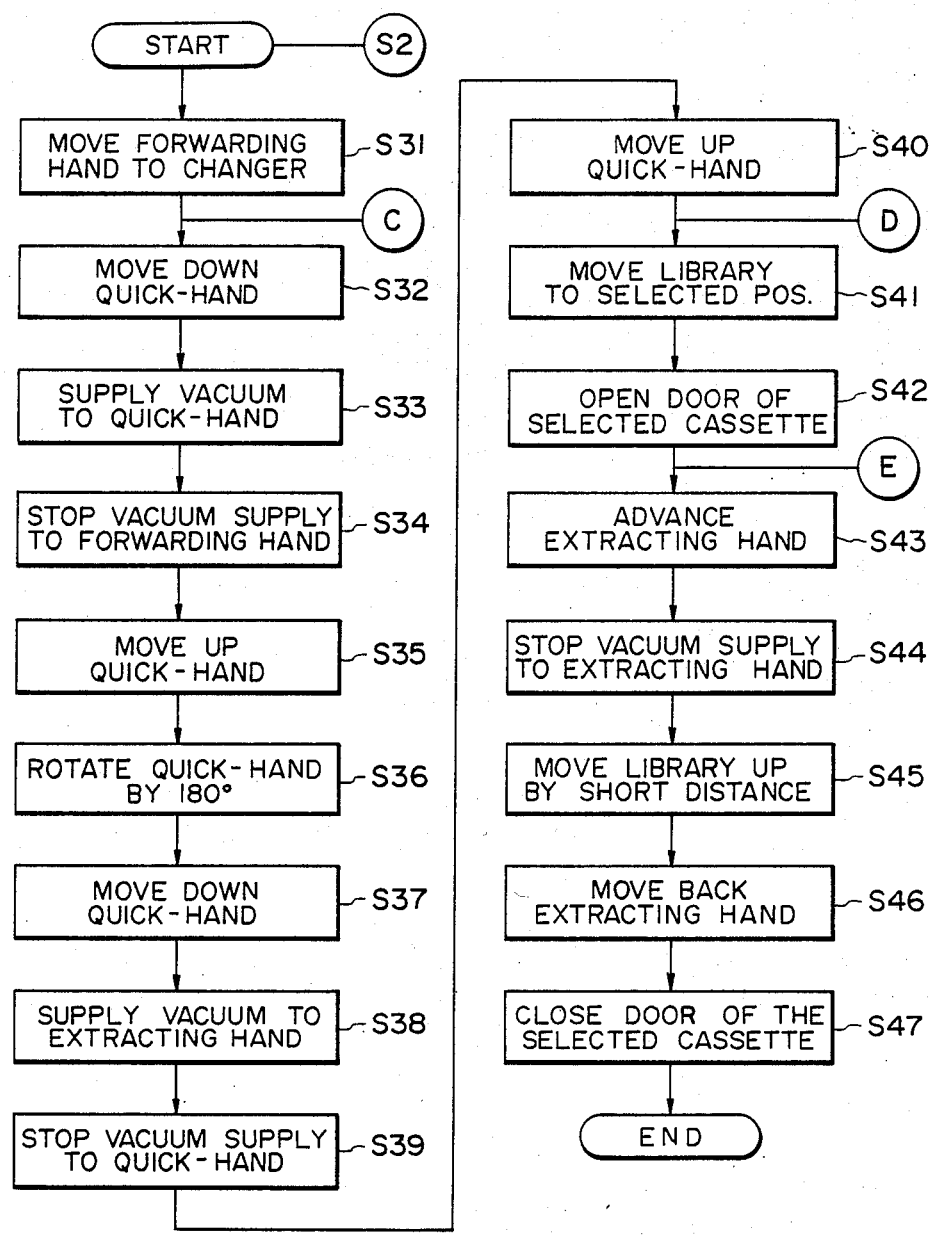
FIG. 3 is a flow chart showing the sequence of a reticle unloading operation.

The above-described sequence from point C to point D in FIG. 3 may be called "reticle changing" by which the reticle 6 can be replaced by another. It should be noted that this portion of the reticle conveying sequence requires the same operation as the reticle changing made in the sequence from point A to point B in FIG. 2. Accordingly, by one and the same sequential operation, the function of working steps (A to B) related to the reticle loading and the function of working steps (C to D) related to the reticle unloading can be accomplished at the same time.

Next, at Step S41, the reticle library 1 is moved to a predetermined position and, thereafter, the door of a cassette 5 into which a reticle 6 is going to be put back is opened (Step S42).

The sequence from point D to point E in FIG. 3 may be called "cassette preparation" by which a cassette is prepared for the return of a corresponding reticle.

Next, at Step S43, the extracting hand 2 is advanced until the photocoupler 25 detects the light-blocking plate 22. At Step S44, the vacuum supply to the extracting hand 2 is intercepted to release the attraction of a reticle 6 which is going to be moved back into a corresponding cassette. At Step S45, the reticle library 1 is moved upwardly only by a distance necessary for allowing transfer of the reticle. Then, at Step S46, the extracting hand 2 is moved backwardly. By this operation, the reticle 6 is put back into its cassette 5. Thereafter, at Step S47, the door of the cassette 5 is closed.

The sequence from point E to point E2 may be called "reticle storing" by which a reticle 6 can be put back into a corresponding cassette 5.

With the above-described operations, a reticle 6 can be unloaded from the exposure station and returned to a corresponding cassette.

Description will now be made of details of reticle changing, taken in conjunction with the flow chart of FIG. 4.

For the reticle changing, first the reticle unloading operation at the sequence S2-C in FIG. 3 is made. Subsequently, the reticle changing operation at the sequence C-D in FIG. 3 is made. By the execution of this reticle changing operation, the sequence A-B (reticle changing) in FIG. 2 relating to the reticle loading is carried out.

Next, the cassette preparation at the sequence D-E in FIG. 3 and the reticle storing at the sequence E-E2 in FIG. 3 are made in parallel to and simultaneously with the reticle setting (setting a reticle into the exposure apparatus) at the sequence B-E1 in FIG. 2.

At the time when the sequence B-E1 is completed, the completion of the reticle changing is signaled to the main assembly of the exposure apparatus.

Thereafter, by the execution of the sequence S1-A in FIG. 2, a reticle to be used subsequently is prepared. Upon completion of this preparation, the reticle changing is accomplished.

Figure 4:
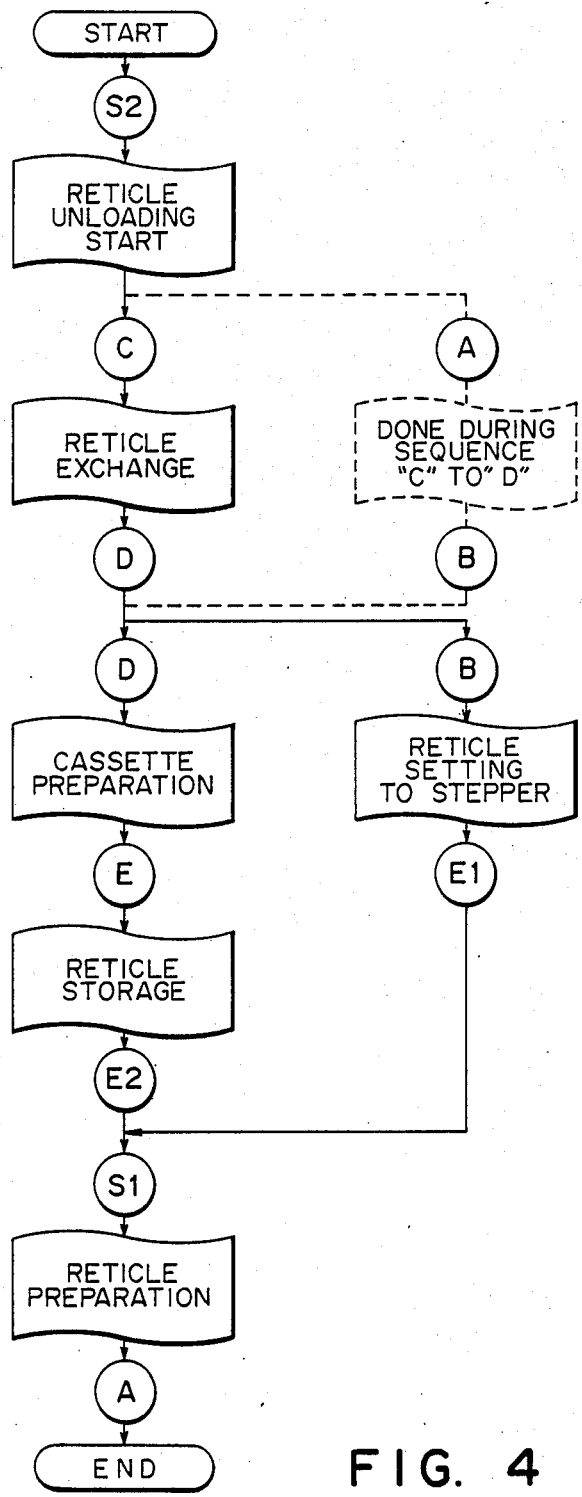
FIG. 4 is a flow chart showing the sequence of a reticle changing operation.

The sequential operation of the present embodiment described hereinbefore may be modified as follows:

For example, in FIG. 4, the cassette preparation at the sequence D-E during the reticle unloading operation may be made in parallel to the sequence S2-D or, alternatively, it may be made in parallel to the sequence C-D. As a further alternative, it may be made during the portion between point A (reticle preparation) and the "END".

Description will now be made of details of a reticle cassette usable in the reticle changer of the present embodiment.

Figure 5:
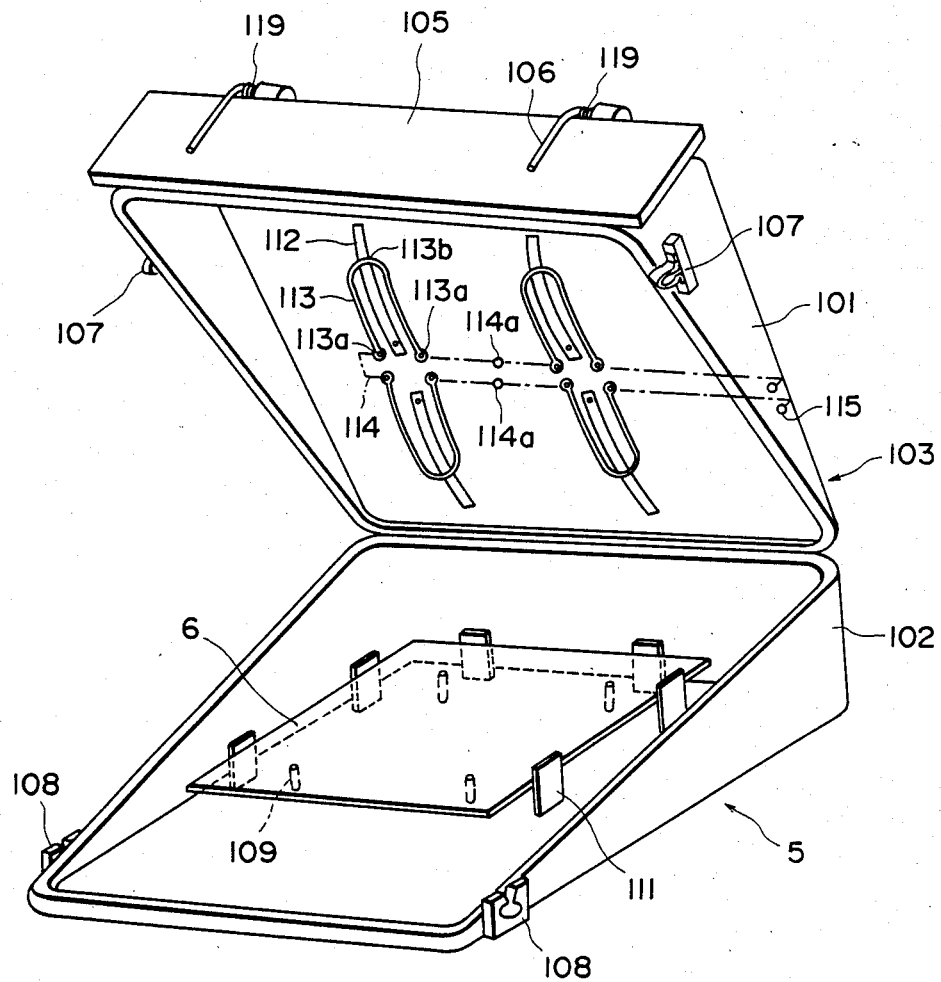
FIG. 5 is a perspective view of a reticle cassette usable in the FIG. 1 embodiment, the cassette being shown in an open state.
Figure 6:
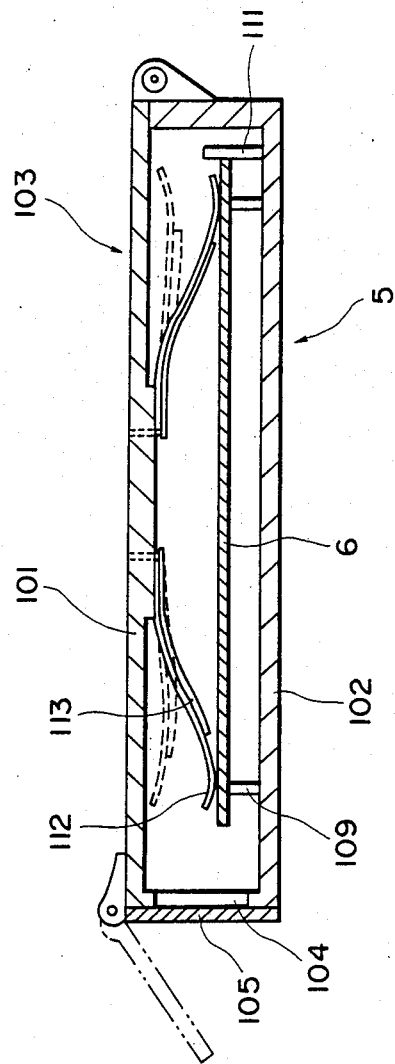
FIG. 6 is a vertical section showing a major portion of the reticle cassette of the FIG. 5 example, the cassette being shown in a closed state.

FIG. 5 is a perspective view of a dust-proof container which is used in the present embodiment as a reticle cassette 5, the container being illustrated as it is opened. FIG. 6 is a vertical section showing the major portion of the container as it is closed.

In FIG. 5, an upper member 101 (lid) and a lower member 102 (tray) are cooperable to provide a closed casing 103. At the back of the container, the upper lid 101 is hinged to the lower tray 102 so that it can be opened and closed. In the front face of the upper lid 101, there is formed an opening 104 for allowing automatic introduction and extraction of a reticle 6, as best seen in FIG. 6. Door 105 is provided so as to sealingly close the opening 104, the door 105 being hinged to the upper lid 101 at 119. The door 105 is continuously urged by a spring 106 in a direction closing the opening 104. The lower tray 102 is provided with four reticle supporting pins 109 each being in the form of a protrusion. Inside of the lower tray 102 and at the left and right side surfaces and the rear surface thereof, there are provided reticle positioning stoppers 111. Upon loading, a reticle 6 is placed on the supporting pins 109 while being guided by the stoppers 111. On the outer side surfaces of the upper lid 101 and the lower tray 102, a pair of locking members 107 and 108 of resiliently insertion type are mounted. These locking members are effective to disengageably couple the upper lid 101 and the lower tray 102 to each other.

On the inside surface of the upper lid 101, four reticle keeping leaf springs 112 are mounted. Each leaf spring 112 has one end fixed to the upper lid so that it forms a "cantilevered leaf spring". As depicted by solid lines in FIG. 6, each leaf spring 112 is arranged so that its free end portion is effective to press a reticle 6, placed on the lower tray 102, from above toward the pins 109.

There are provided four releasing members 113, each engaging corresponding ones of the leaf springs 112. In this embodiment, each releasing member 113 is formed by a shape memory alloy which can be made of an alloy of titanium and nickel, for example. Each releasing member 113 has a U-shape as illustrated, and a curved portion 113b thereof engages with corresponding a one of the leaf springs 112 while the end portions thereof are fixed to the upper lid side and are connected to terminals 113a, respectively. The terminals 113a are connected, in series, by means of a patterned wiring or a suitable wiring means such as denoted at 114 or, alternatively, they are individually connected to electrode terminals 115 provided on the outer side surface of the upper lid 101.

The electrode terminals 115 are formed at such positions that, when the container is inserted into the reticle library 1, the electrode terminals 115 contact power-supplying terminals (not shown) provided within the reticle library 1.

The shape memory alloy which forms a releasing member 113 is arranged so that it normally has a shape, such as depicted by a solid line in FIG. 6, that does not interfere with the application of a pressing force of a corresponding leaf spring 112 to the reticle 6 while, on the other hand, it is deformed and moved upwardly as depicted by a broken line in FIG. 6 in response to the supply of an electric current from the electrode terminals 115, to thereby lift the leaf spring 112 so as to separate the same from the reticle 6.

When a reticle 6 is introduced into the dust-proof container (reticle cassette) of the above-described structure and when the upper lid 101 is closed, the closing motion of the lid 101 causes the leaf springs 112 to press the reticle 6 against the pins 109. By this, the reticle 6 is held immovable within the container.

For automatic extraction of a reticle contained in the container, an electric current is applied to each of the releasing members 113 each being formed by a shape memory alloy. In response thereto, the shape memory alloy is deformed, by heating, to separate the leaf spring 112 from the reticle 6, as depicted by the broken line in FIG. 6 to thereby release the pressing force of the leaf spring. In this state, the door 105 is opened such as depicted by a broken line in FIG. 6, and the reticle 6 contained in the container is extracted out of the container by means of the extracting hand 2 shown in FIG. 1.

For automatic loading of the reticle 6 into the container after the reticle 6 is used for the exposure (photoprinting), the reticle 6 is inserted into the container by use of the extracting hand 2, with the shape memory alloy being continuously energized. After the reticle 6 is placed on the pins 109, the supply of the electric current is intercepted. As a result, the shape memory alloy takes again its initial shape as depicted by the solid line in FIG. 6, such that the leaf spring 112 urges again the reticle 6 to hold the same immovable on the pins 109.

The number, the position and the shape of the leaf springs 112 constituting the reticle pressing means may be changed as desired. Further, the manner of electric connection of the electrodes for the shape memory alloy, the position of the electrode terminal and so on may be changed as desired. The electrode terminal 115 may be provided at a position best suited to the structure of an apparatus into which the container is incorporated. For example, while in the FIG. 5 embodiment four shape memory alloys are electrically connected in series so that two ends are connected to the electrode terminals 115, the manner of electric connection may be changed so that the terminals 113a for each shape memory alloy may be directly connected to the electrode terminals 115 (namely, eight terminals may be connected to the electrode terminals 115). Alternatively, at the points denoted at 114a in FIG. 5, the wiring may be branched toward another set of electrode terminals 115. By selecting an appropriate manner of wiring, only a required shape memory alloy or alloys may be selectively energized.

Figure 7A:
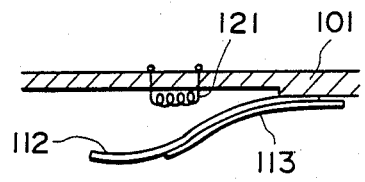
FIGS. 7A-7E are fragmentary sections, respectively, showing further examples of reticle cassettes.

In place of direct application of an electric current to the releasing members 113, a suitable heating means 121 (see FIG. 7A) such as a rubber heater or otherwise may be used to directly heat the releasing member 113 or to indirectly heat the releasing member from the outside of the container and by way of a suitable heat transmitting member. It is a possible alternative that, in place of the application of an electric current, the releasing member 113 may be irradiated with heat rays 122 such as infrared rays, as depicted in FIG. 7B. The releasing member 13 is operable in the similar manner in response to the irradiation of such heat rays.

Figure 7D:
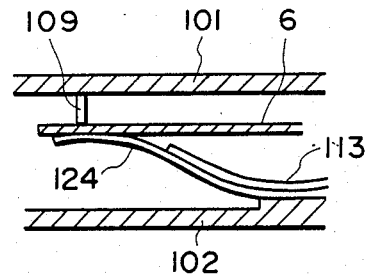
Figure 7B:
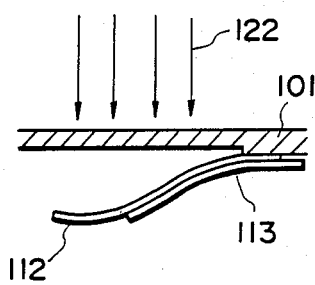
Figure 7E:
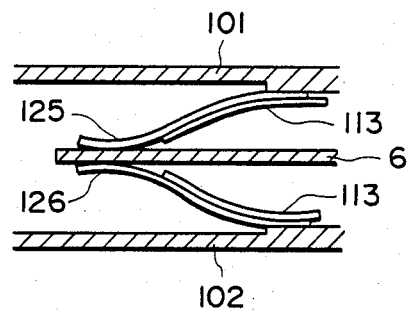
Figure 7C:
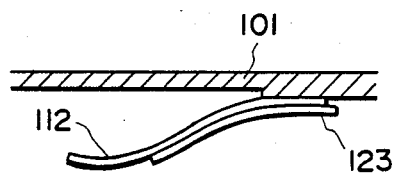

The shape memory alloy used in the FIG. 5 embodiment may be replaced by a bimetal 123 such as shown in FIG. 7C. By heating the bimetal 123, it can deform so as to separate the leaf spring 112 from the reticle 6. Further, the leaf spring 112 itself may be formed by a bimetal.

The container may be modified so that a reticle 6 is supported by an upper lid 101 side and the supported reticle 6 is held immovable by means of leaf springs 124 which are provided on a lower tray 102 side, such as illustrated in FIG. 7D. Also, leaf springs 125 and 126 may be provided both on an upper lid 101 side and a lower tray 102 side, as shown in FIG. 7E, such that a reticle 6 is held immovable by pressing forces applied thereto from the opposite sides thereof.

Figure 8A:
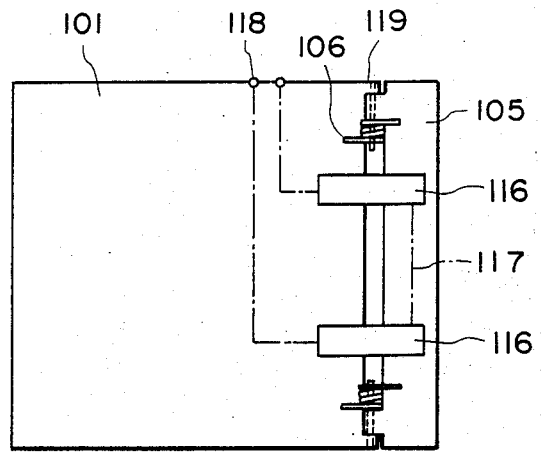
FIG. 8A is a top plan view and FIGS. 8B and 8C are side views, respectively, all showing another example of reticle cassette.
Figure 8B:
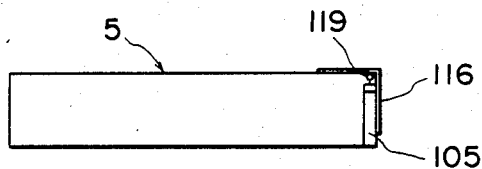
Figure 8C:
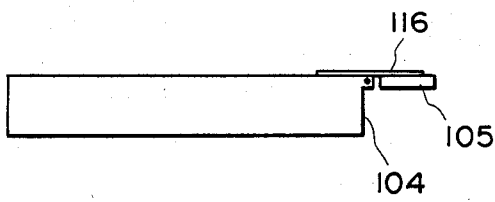

On the other hand, the reticle extracting/introducing opening of a container (reticle cassette) such as depicted at 104 in FIG. 6, may be openably closed in various ways. For example, in the cases of the reticle cassettes 5 of the types described with reference to FIGS. 5–7E, one or more shape memory alloys may be used to open/close the door 105 under the control from the outside of the container. FIGS. 8A–8C show a dust proof container usable as a reticle cassette and having such a mechanism including shape memory alloys.

In FIGS. 8A–8C, a door 105 is provided so as to sealingly cover an opening 104. The door 105 is coupled to an upper lid 101 by means of hinges 119. The door 105 is continuously urged by springs 106 in a direction closing the opening 104. The upper lid 101 and the door 105 are connected to each other by means of shape memory alloys 116. Each shape memory alloy 116 is adapted to deform in a direction opening the door 105 when a predetermined temperature is established in response to the application of an electric current or otherwise. Denoted at 117 in FIG. 8A is a wiring means for electrically connecting the shape memory alloys 116. Denoted at 118 are exposed electric terminals which are provided on the outer side surface of the upper lid 101.

For automatic extraction of a reticle contained in such a reticle cassette, electric currents are supplied to the shape memory alloys 116 via the electric terminals 118, by means of an energization mechanism which is fixedly provided, for the opening/closing of a door, at the reticle extracting station whereat the extracting hand 2 shown in FIG. 1 operates for the reticle extraction. In response to the supply of the electric currents, the shape memory alloys 116 deform, from the state shown in FIG. 8B to the state shown in FIGS. 8A and 8C, to thereby open the door 105 of the upper lid 101. Subsequently, as described hereinbefore, electric currents are supplied to the shape memory alloys 13 so that the pressing of the reticle 6 is released. Thereafter, by use of the extracting hand 2, the reticle 6 kept in the container is extracted.

In order to automatically put the reticle 6 back into the container after it is used, the reticle 6 is introduced into the container with the door 105 being maintained open as a result of the energization of the shape memory alloys 116. After the reticle 6 is placed on the supporting pins 109, the supply of the electric currents to the shape memory alloys 116 is intercepted, with the result that each shape memory alloy 116 deforms under the influence of the spring 106 and takes its initial shape. Thus, the door 105 again closes the opening 104 of the upper lid 101.

The number, the position and the shape of the shape memory alloys 116 constituting the releasing means may be changed as desired. Further, the manner of electric connection of the electrodes for the shape memory alloy, the position of the electrode terminal and so on may be changed as desired. The electrode terminal 118 may be provided at a position best suited to the structure of an apparatus into which the container is incorporated. Further, by selecting an appropriate manner of wiring, only a desired shape memory alloy 116 may be selectively energized.

Further, in place of direct application of an electric current to the shape memory alloy 116 for the operation, a suitable heating means such as a rubber heater may be used to directly heat the releasing member or, if desired, to indirectly heat the releasing member by way of a suitable heat transmitting member. Additionally, in place of the application of electric currents, the shape memory alloys 116 may be irradiated with heat rays such as infrared rays. In such case, the heat memory alloys may be operable in a similar manner in response to the irradiation of the heat rays.

Figure 9:
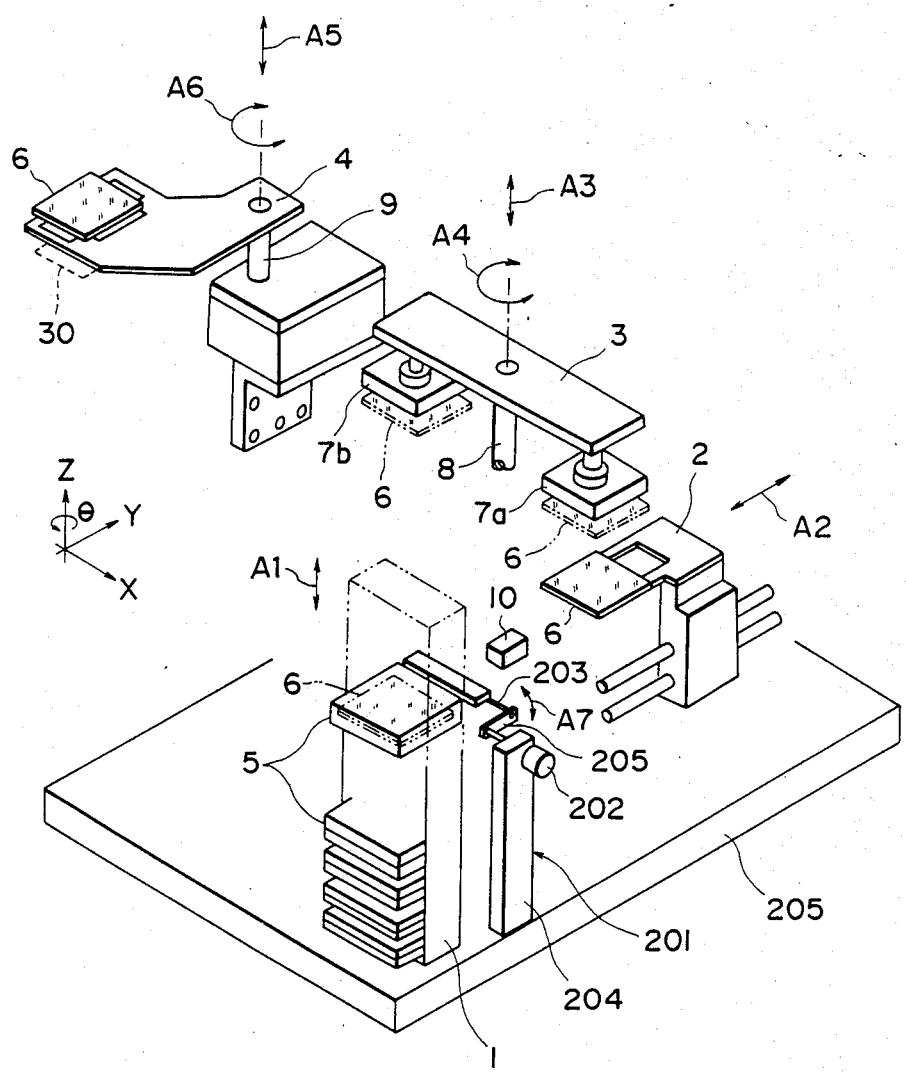
FIG. 9 is a perspective view showing a modified form of the FIG. 1 embodiment, wherein a mechanical opening/closing device is used.
Figure 10A:
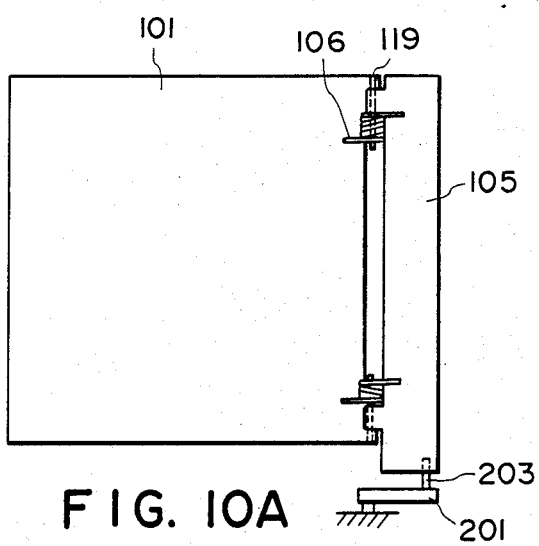
FIG. 10A is a top plan view.
Figure 10B:
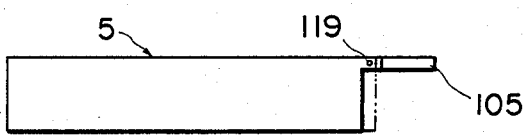
FIG. 10B is a side view and FIG. 10C is a fragmentary view, all showing another example of a reticle cassette having a door adapted to be opened/closed mechanically.
Figure 10C:
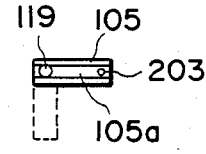

In place of using shape memory alloys for the opening/closing of a door of a reticle cassette, as described hereinbefore, mechanically movable components may be used. FIG. 9 shows an embodiment of a reticle changer using such a mechanical arrangement 201 for the opening/closing of a door of each reticle cassette. FIGS. 10A–10C show an example of a reticle cassette usable in the reticle changer of the FIG. 9 embodiment. Also, in the present embodiment, the door opening/closing mechanism may be provided at a fixed portion. It is added that the portion of the structure of the reticle changer of the FIG. 9 embodiment, which is not illustrated in the drawing, has the same arrangement as the corresponding portion of the reticle changer of the FIG. 1 embodiment. Further, in the FIG. 9 embodiment, the same reference numerals as those used in the FIG. 1 embodiment are assigned to corresponding elements.

The door opening/closing mechanism 201 of the FIG. 9 embodiment includes an engaging pin 203 which is engageable with a door 105 of a reticle cassette 5 having been set at the reticle extracting station (or position), corresponding to the position of the extracting hand 2, as a result of the movement of the reticle library 1 along the Z axis. The engaging pin 203 is engageable with a channel-shaped groove 105a which is formed in the side surface of the door 105, as best seen in FIG. 10C. The engaging pin 203 is a stud element mounted to a lever 205 which is rotatable under the influence of a driving motor 202, about a driving shaft of the motor 202 in a direction denoted by an arrow A7 in FIG. 9. Thus, the drive of the motor 202 causes the engaging pin 203 to move so as to open/close the door 105. The mechanism including the driving motor 202 is fixedly supported at the illustrated position (namely, the reticle extracting position) by means of a supporting member 204 which is fixed to a base member 205.

While the invention has been described with reference to the structures disclosed herein, it is not confined to the details set forth and this application is intended to cover such modifications or changes as may come within the purposes of the improvements or the scope of the following claims.

What is claimed is:

1. A conveying system usable with a plurality of reticles, each having a pattern prepared for manufacture of integrated circuits and each having a bar code that bears information related to the reticle and usable with a plurality of casings, each having an openable door, for accommodating associated reticles therein, said conveying system for conveying a reticle between a first station for reticle keeping and a second station for reticle setting, said system comprising:
   a support provided at the first station for supporting the casings in a stacked relationship in a first, substantially vertical direction;
   driving means for moving said support in the first direction for displacement to a desired casing to locate a desired reticle at a reticle transfer position which is at a fixed height in said system;
   opening means provided at the reticle transfer position for opening an openable door of a casing displaced to the reticle transfer position by said support;
   a first hand mechanism comprising a first hand accessible through an opening, defined by the opening of an openable door of a casing displaced to the reticle transfer position, to an inside of that casing to allow transfer of a reticle out of or into that casing, said first hand mechanism further comprising conveying means for conveying a reticle between the reticle transfer position and a first intermediate position in a second, substantially horizontal direction which is perpendicular to the first direction;
   a second hand mechanism comprising a second hand for conveying a reticle between the reticle setting station and a second intermediate position;
   aligning means provided on said second hand and having a plurality of engaging members for engaging a peripheral edge of a reticle so as to align the same with respect to the reticle setting station during conveyance of the same by said second hand;
   interchanging means for interchanging a first reticle placed at the first intermediate position by said first hand mechanism and a second reticle placed at the second intermediate position by said second hand mechanism, said interchanging means having a rotational shaft for transmitting a rotational drive and a third, rotatable hand which is rotatable about said rotational shaft; and
   a bar code reader provided between the reticle transfer position and the first intermediate position for reading a bar code of a reticle during conveyance of the same by said first hand mechanism in the second direction.

2. A conveying system according to claim 1, wherein said driving means moves said support a predetermined amount in the first direction after said first hand enters a casing through an opening thereof.

* * * * *